(12) United States Patent
Larson et al.

(10) Patent No.: US 11,946,781 B2
(45) Date of Patent: Apr. 2, 2024

(54) SENSOR ASSEMBLIES COUPLED TO SLIDING ASSEMBLIES FOR POSITION SENSING

(71) Applicant: Hewlett-Packard Development Company, L.P., Spring, TX (US)

(72) Inventors: David Bert Larson, Boise, ID (US); Clinton Troy Jensen, Boise, ID (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 228 days.

(21) Appl. No.: 17/584,290

(22) Filed: Jan. 25, 2022

(65) Prior Publication Data
US 2023/0236041 A1 Jul. 27, 2023

(51) Int. Cl.
*G01D 5/32* (2006.01)

(52) U.S. Cl.
CPC ..................... *G01D 5/32* (2013.01)

(58) Field of Classification Search
CPC .......... G01D 5/32; H04Q 1/04; H03K 17/968; H04N 23/54
USPC .......................................................... 356/614
See application file for complete search history.

(56) References Cited

U.S. PATENT DOCUMENTS

| | | | | |
|---|---|---|---|---|
| 6,144,549 A | * | 11/2000 | Moss | H05K 7/1494 345/169 |
| 6,219,323 B1 | * | 4/2001 | Fukatsu | B60K 37/04 720/650 |
| 6,778,381 B1 | * | 8/2004 | Bolognia | H05K 7/1494 348/794 |
| 7,133,085 B2 | * | 11/2006 | Morita | B60R 11/0235 348/836 |
| D560,665 S | * | 1/2008 | Wang | D14/313 |
| 7,436,674 B2 | * | 10/2008 | Barsun | H05K 7/1494 345/169 |
| 7,474,229 B2 | * | 1/2009 | Franz | G06F 1/187 340/815.4 |
| 7,580,254 B2 | * | 8/2009 | Anderson | G06F 1/181 361/679.41 |
| 8,792,651 B2 | * | 7/2014 | Uchida | H04R 1/02 381/86 |

\* cited by examiner

*Primary Examiner* — Isiaka O Akanbi
(74) *Attorney, Agent, or Firm* — Brooks, Cameron & Huebsch, PLLC (57) ABSTRACT

According to examples, an apparatus may include a base, a sliding assembly slideably coupled to the base, and a sensor assembly coupled to the sliding assembly. The sliding assembly may moveably support a control panel and the sensor assembly may sense positions of the sliding assembly relative to the base. The sensor assembly may include a first sensor to sense that the sliding assembly is in a first position relative to the base, and a second sensor to sense that the sliding assembly is in a second position relative to the base. A sensed state of the first sensor and a sensed state of the second sensor may be used to determine that the sliding assembly is in a third position relative to the base.

15 Claims, 7 Drawing Sheets

100   RETRACTED STATE

FIG. 1A

100   EXTENDED STATE

400    RETRACTABLE CONTROL PANEL ASSEMBLY

RETRACTED STATE

FIG. 4A

400    EXTENDED STATE

SENSOR ASSEMBLIES COUPLED TO SLIDING ASSEMBLIES FOR POSITION SENSING

BACKGROUND

Electronic devices, such as imaging devices, may have control panels that may be mounted on the electronic devices. These control panels may be used to display user interfaces for the electronic devices. In some instances, the control panels may be movable, which may allow display angles of the control panels to be changed.

BRIEF DESCRIPTION OF THE DRAWINGS

Features of the present disclosure are illustrated by way of example and not limited in the following figure(s), in which like numerals indicate like elements, in which.

DETAILED DESCRIPTION

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

Electronic devices, such as imaging devices, may include control panels (CPs), which may display user interfaces (UIs). In some examples, the CPs may be movable, however, in some instances, the positions of the CPs may be unknown. Disclosed herein are apparatuses that may facilitate sensing of positions of movable CPs. By way of particular example, a CP for a multi-function printing device may be retractable into a housing of the multifunction printing device. In some examples, the CP may be partially retractable, in which case a visible area of the display panel of the CP in the retracted state may be smaller than that in the extended state. In such instances, CP position sensing may enable appropriate UIs to be automatically displayed on the CP based on the sensed position of the CP. For instance, detection of multiple positions of the CP may be possible, such as an extended state (out), a retracted state (in), and a transition state in between the extended state and the retracted state. In these instances, the CP may display an appropriate UI for each of the detected positions of the CP, which may result in a more positive experience for the user. In some examples, the UI may include various types of user interface devices, for instance, displayed menus, displayed messages, indicator lights, such as LED lights disposed on a side surface of the CP, audible indications, haptic interfaces, and/or the like. By way of particular example, the UI may include different types of menu screens that may be displayed based on the detected position of the CP. In another particular example, the UI may include different color LED lights that may be activated based on the detected position of the CP.

In some examples, the apparatus may include a sliding assembly and a sensor assembly to sense various positions of the sliding assembly. The apparatus may implement different display configurations based on the sensed positions of the sliding assembly. For instance, the apparatus may output a full UI in a case in which the sliding assembly is sensed to be in the extended state, activate a portion of the display area to display a relatively smaller UI in a case in which the sliding assembly is sensed to be in the retracted state, and/or output a message to fully extend the CP in a case in which the CP is sensed to be in the transition state. In some examples, the sliding assembly may also provide a haptic feedback based on a position of the sliding assembly.

Figure 1A:
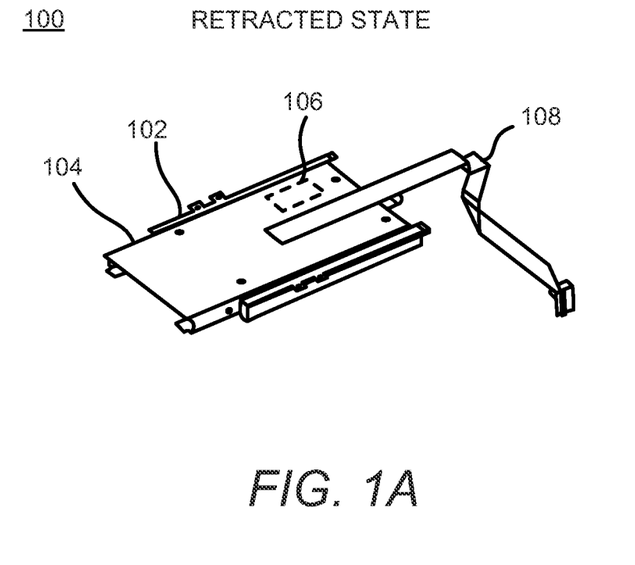
FIG. 1A shows a perspective view of an example apparatus in a retracted state, in which the example apparatus may include a base, a sliding assembly slideably coupled to the base, and a sensor assembly coupled to the sliding assembly to sense positions of the sliding assembly relative to the base.
Figure 1B:
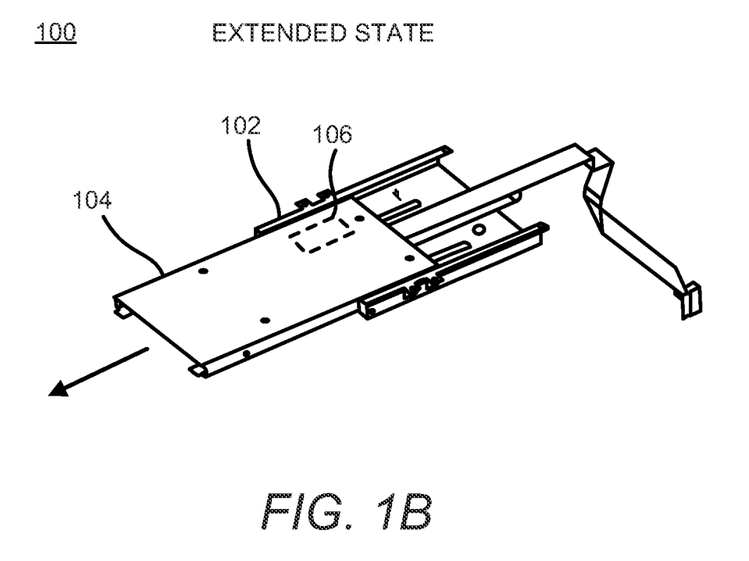
FIG. 1B shows a perspective view of the example apparatus depicted in FIG. 1A in which the sliding assembly is in an extended state.
Figure 2:
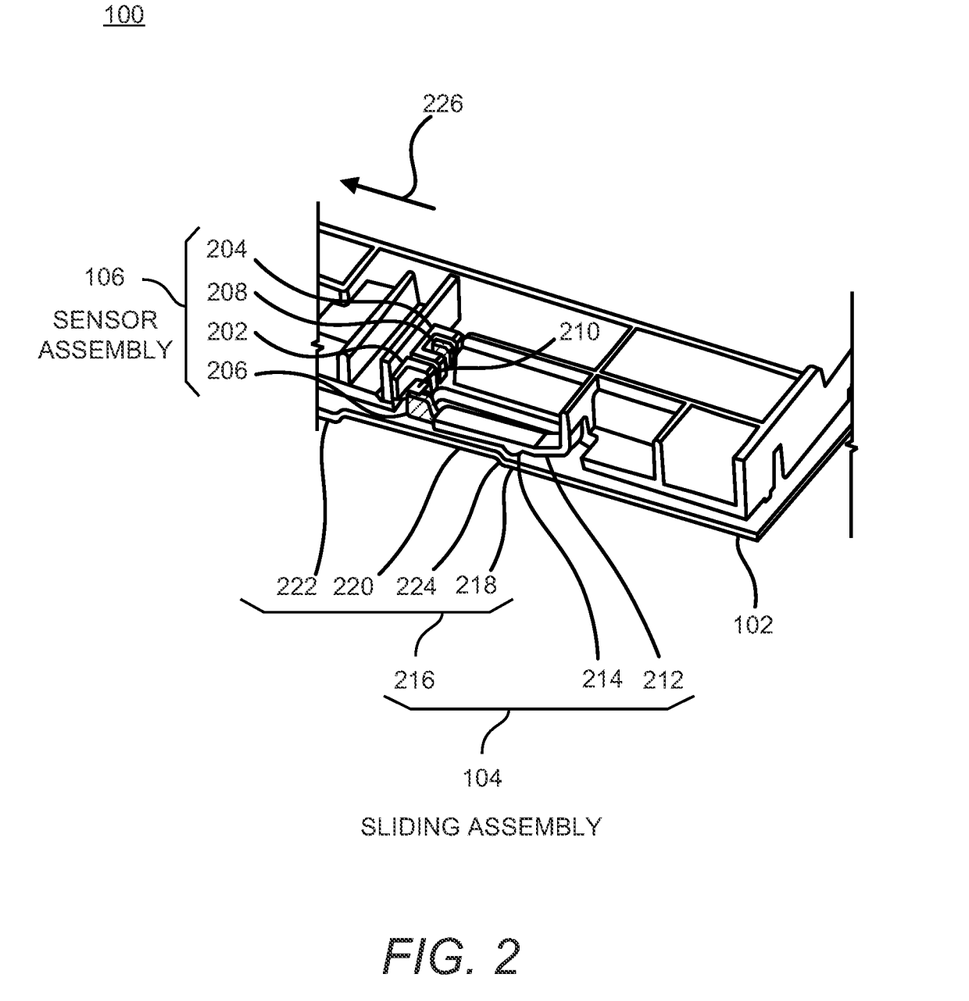
FIG. 2 shows a cutaway view of the example apparatus depicted FIGS. 1A and 1B, including the sliding assembly and the sensor assembly.
Figure 3A:
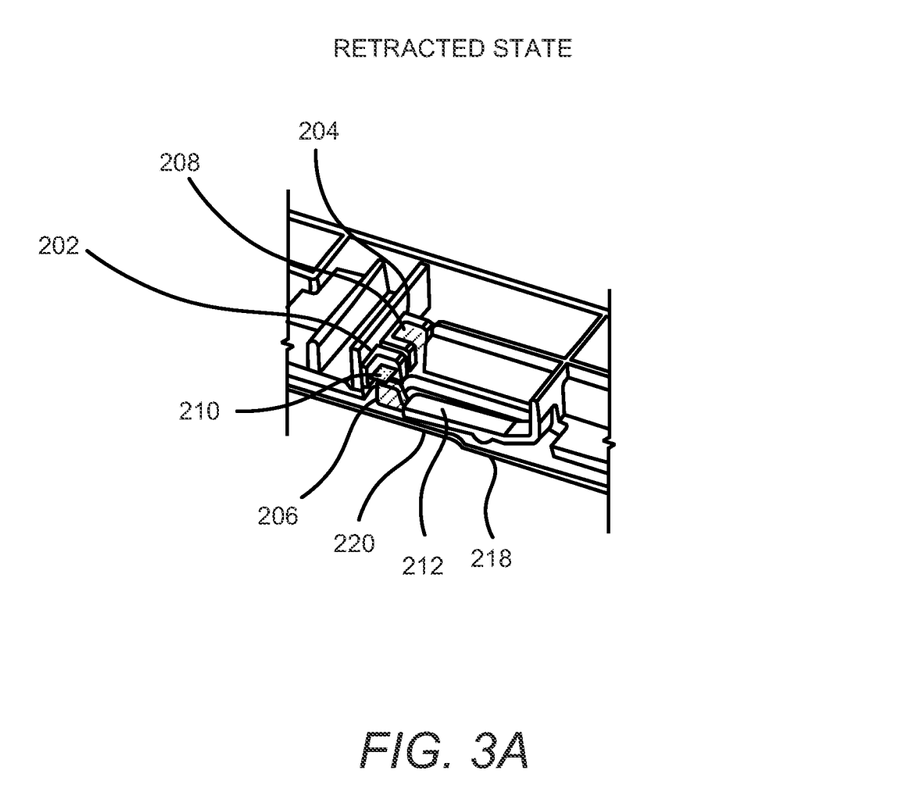
FIG. 3A shows a cutaway view of the example apparatus depicted in FIG. 2, in which the sliding assembly is in a retracted state.
Figure 3B:
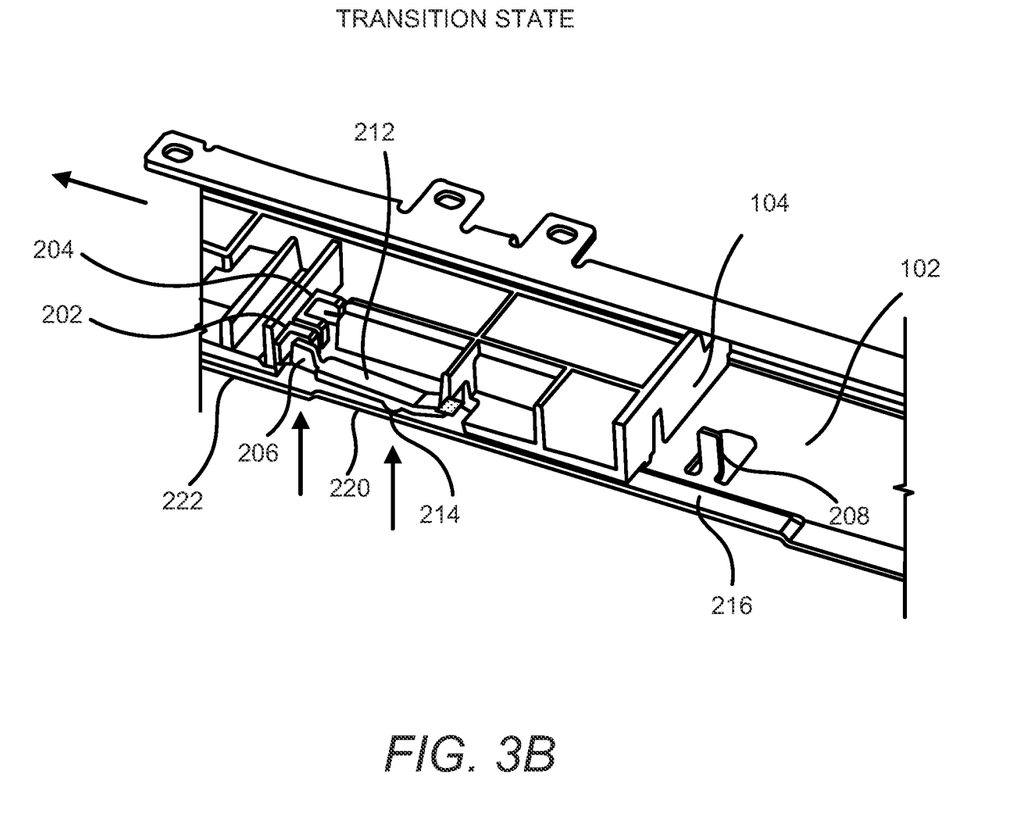
FIG. 3B shows a cutaway view of the example apparatus depicted in FIG. 2, in which the sliding assembly is in a transition state.
Figure 3C:
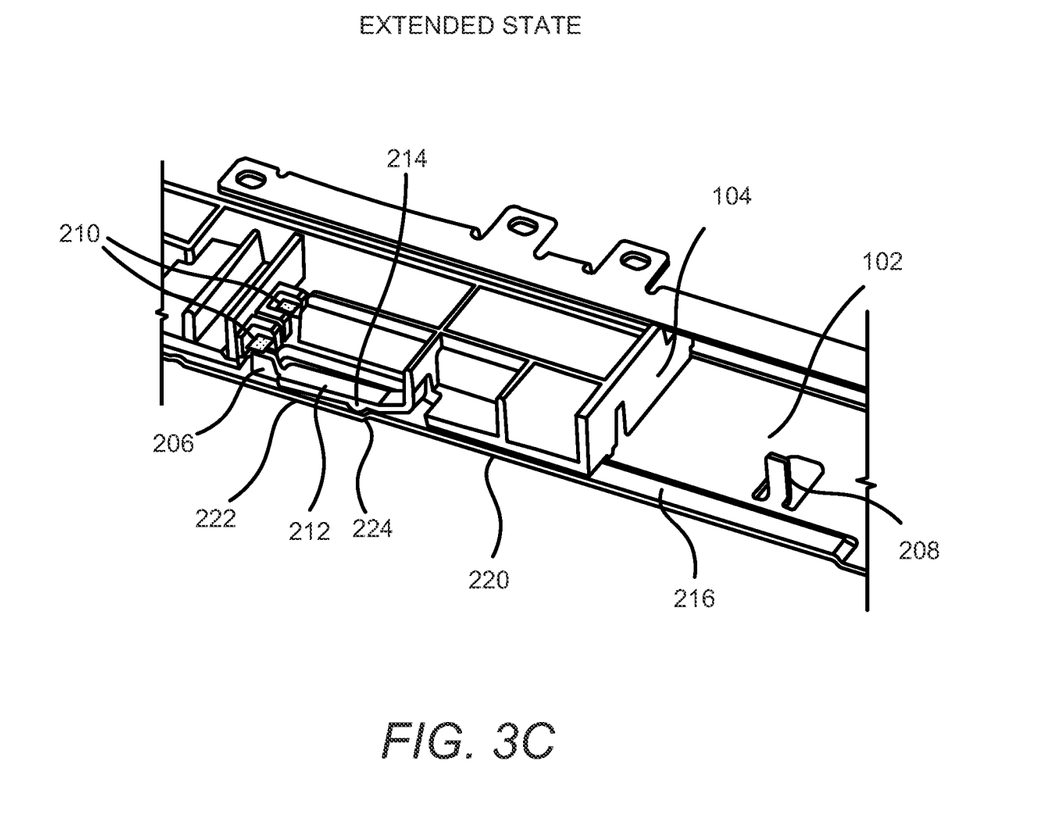
FIG. 3C shows a cutaway view of the example apparatus depicted in FIG. 2, in which the sliding assembly is in an extended state.

Reference is made to FIGS. 1A to 1B, 2, and 3A to 3C. FIG. 1A shows a perspective view of an example apparatus 100 in a retracted state, in which the example apparatus 100 may include a base 102, a sliding assembly 104 slideably coupled to the base 102, and a sensor assembly 106 coupled to the sliding assembly 104 to sense positions of the sliding assembly 104 relative to the base 102. FIG. 1B shows a perspective view of the example apparatus 100 depicted in FIG. 1A in which the sliding assembly 104 is in an extended state. FIG. 2 shows a cutaway view of the example apparatus 100 depicted in FIGS. 1A and 1B, including the sliding assembly 104 and the sensor assembly 106. FIG. 3A shows a cutaway view of the example apparatus 100 depicted in FIG. 2, in which the sliding assembly 104 is in a retracted state. FIG. 3B shows a cutaway view of the example apparatus 100 depicted in FIG. 2, in which the sliding assembly 104 is in a transition state. FIG. 3C shows a cutaway view of the example apparatus 100 depicted in FIG. 2, in which the sliding assembly 104 is in an extended state. It should be understood that the apparatus 100 depicted in FIGS. 1A, 1B, 2, 3A, 3B, and 3C may include additional features and that some of the features described herein may be removed and/or modified without departing from the scope of the apparatus 100.

The apparatus 100 may include a base 102 and a sliding assembly 104 that may be slideably coupled to the base 102. In some examples, a CP, such as the CP 402 depicted in FIGS. 4A and 4B, may be mounted to a distal end of the base 102. The base 102 may be mounted to a body of an electronic device, such as the imaging device 500 depicted in FIGS. 5A and 5B. The sliding assembly 104 may enable the mounted CP to be moved relative to the electronic device. By way of particular example and for purposes of illustration, the sliding assembly 104 may be positioned in various positions including a first position, for instance when the sliding assembly 104 is in a transition state as depicted in FIG. 3B, a second position, for instance a retracted state as depicted in FIG. 3A in which the sliding assembly 104 is retracted in the base 102, or a third position, for instance when the sliding assembly 104 is in an extended state as depicted in FIG. 3C in which the sliding assembly 104 is extended out from the base 102.

The apparatus 100 may include a sensor assembly 106 to sense the various positions of the sliding assembly 104 relative to the base 102. In some examples, various components of the sensor assembly 106 may be disposed on the sliding assembly 104 and the base 102. The sensor assembly 106 may include sensors that may be triggered by a movement or a position of the sliding assembly 104. For instance, the sensor assembly 106 may include a first sensor 202 to sense that the sliding assembly 104 is in a first position, such as in the transition state. The sensor assembly 106 may include a second sensor 204 to sense that the sliding assembly is in a second position, such as in the retracted state. In some examples, based on a sensed state of the first sensor 202 and a sensed state of the second sensor 204, the sensor assembly 106 may determine that the sliding assembly 104 is in another position, for instance a third position, such as in the extended state.

The sensor assembly 106 may sense objects in vicinities of the sensors. In some examples, the sensor assembly 106 may include a first tab 206 and a second tab 208 disposed on the sliding assembly 104 to trigger sensors in the sensor assembly 106. For instance, the first tab 206 may be moved relative to the first sensor 202 to cause the sliding assembly 104 to trigger the first sensor 202 when the sliding assembly 104 is moved to the first position. The second tab 208 may be moved relative to the second sensor 204 to cause the sliding assembly 104 to trigger the second sensor 204 when the sliding assembly 104 is moved to the second position.

In some examples, the first sensor 202 and the second sensor 204 may be any of various types sensors that may be triggered by sensing nearby objects. In some examples, the first sensor 202 and the second sensor 204 may be optoelectric sensors, hall sensors, mechanical switches, and/or the like. By way of particular example and for purposes of illustration, the first sensor 202 and the second sensor 204 are described hereinafter as being optoelectric sensors. In this example, the sensor assembly 106 may include tabs to block light emitted from the optoelectric sensors based on positions of the sliding assembly 104. For instance, a first tab 206 may trigger the first sensor 202 and second tab 208 may trigger the second sensor 204.

In some examples, the first tab 206 may be disposed on the sliding assembly 104 to move based on a movement of the sliding assembly 104 to trigger the first sensor 202. In some examples, the sliding assembly 104 may include a flexible arm 212 disposed on the sliding assembly 104. A first end of the flexible arm 212 may be fixed to the sliding assembly 104 and a second end of the flexible arm 212 may be movable based on a flex in the flexible arm 212. The second end of the flexible arm 212 may be connected to the first tab 206, which may allow the first tab 206 to be moved.

The sliding assembly 104 may include a sliding tab 214 disposed on a surface of the flexible arm 212. The sliding tab 214 may contact a surface of the base 102 during movement of the sliding assembly 104 relative to the base 102. In this example, a shape of the surface of the base 102 may push the sliding tab 214 away from the base 102, which in turn may flex the flexible arm 212, which in turn may cause the second tab 208 to move.

In some examples, the sliding tab 214 may contact a sliding track 216 disposed on the base 102. The sliding track 216 may be an embossed surface that may be formed on a surface of the base 102. The sliding track 216 may be in contact with the sliding tab 214 throughout a range of motion of the sliding assembly 104, for instance from a fully retracted state to a fully extended state, in a direction of the arrow 226 as depicted in FIG. 2.

The sliding track 216 may include a first lower section 218, a raised section 220, and a second lower section 222. The first lower section 218 may have a first height relative to the base 102. The first height of the first lower section 218 may position the sliding tab 214, and in turn position the first tab 206, in a lowered position in which the first tab 206 may not be positioned adjacent to the first sensor 202. The first lower section 218 may be correlated with a retracted state of the sliding assembly 104 depicted in FIG. 3A.

The raised section 220 of the sliding track 216 may have a second height from the base 102 that may be greater than the first height. The second height of the raised section 220 may position the first tab 206 in a raised position, which may be closer to the first sensor 202. When the sliding tab 214 contacts the raised section 220, the first tab 206 may be raised to be positioned adjacent to the first sensor 202 to trigger the first sensor 202. The raised section 220 may be correlated with a transition state of the sliding assembly 104 depicted in FIG. 3B.

The second lower section 222 of the sliding track 216 may have the first height, which may position the first tab 206 in the lowered position, in which the first sensor 202 is not triggered. The second lower section 222 may be disposed adjacent to the raised section 220, opposite the first lower section 218. The second lower section 222 may be correlated with an extended state of the sliding assembly 104 as depicted in FIG. 3C.

In some examples, a step 224 may be disposed between the raised section 220 and the first lower section 218 and/or the second lower section 222. The step 224 may cause a haptic feedback as the sliding tab 214 moves across the step 224 to transition between the raised section 220 and the first lower section 218 and/or the second lower section 222. In some examples, the angle of the step 224 may be increased or decreased to change the amount of haptic response.

The second tab 208 may trigger the second sensor 204. The second tab 208 may be disposed on a surface of the base 102. In some examples, the second tab 208 may be positioned on the base 102 at a position in which, when the sliding assembly 104 is in the second position, or the retracted state, the second tab 208 may be positioned adjacent to the first sensor 202 to trigger the first sensor 202. In this instance, a movement of the sliding assembly 104 to move away from the first position, for instance to extend the CP, may cause the second tab 208 to move away from the second sensor 204.

In some examples, a combination of states of the first sensor 202 and the second sensor 204 may be used to determine a state of the sliding assembly 104. By way of particular example, in the retracted state as depicted in FIG. 3A, the first sensor 202 may be un-triggered, or in an inactive state, and the second sensor 204 may be triggered, or in an active state. For instance, the second sensor 204 and the second tab 208 may be positioned at predetermined locations on the sliding assembly 104 to cause the second tab 208 to block the light 210 emitted from the second sensor 204 when the sliding assembly 104 is in the second position. In this position, the first tab 206 may be located relative to the first sensor 202 where it may not block the light 210 emitted from the first sensor 202. Based on a determination that the first sensor 202 is in an inactive state and the second sensor 204 is in an active state, the sensor assembly 106 may determine that the sliding assembly 104 is in the retracted state.

In the transition state, as depicted in FIG. 3B, the first sensor 202 may be triggered, or in an active state, and the second sensor 204 may be un-triggered, or in an inactive state. For instance, the first sensor 202 and the first tab 206 may be positioned at predetermined locations on the sliding assembly 104 such that the first tab 206 may block the light 210 emitted from the first sensor 202 and the second tab 208 may not block the light 210 emitted from the second sensor 204. Based on a determination that the first sensor 202 is in an active state and the second sensor 204 is in an inactive state, the sensor assembly 106 may determine that the sliding assembly 104 is in the transition state.

In the extended state, as depicted in FIG. 3C, both of the first sensor 202 and the second sensor 204 may be un-triggered, or in an inactive state. For instance, when the sliding assembly 104 is positioned in the extended state, the first tab 206 and the second tab 208 may be positioned such that the light 210 emitted from the first sensor 202 is not blocked by the first tab 206 and the light 210 emitted from the second sensor 204 is not blocked by the second tab 208. Based on a determination that the first sensor 202 and the second sensor 204 are both in inactive states, the sensor assembly 106 may determine that the sliding assembly 104 is in the extended state.

Figure 4A:
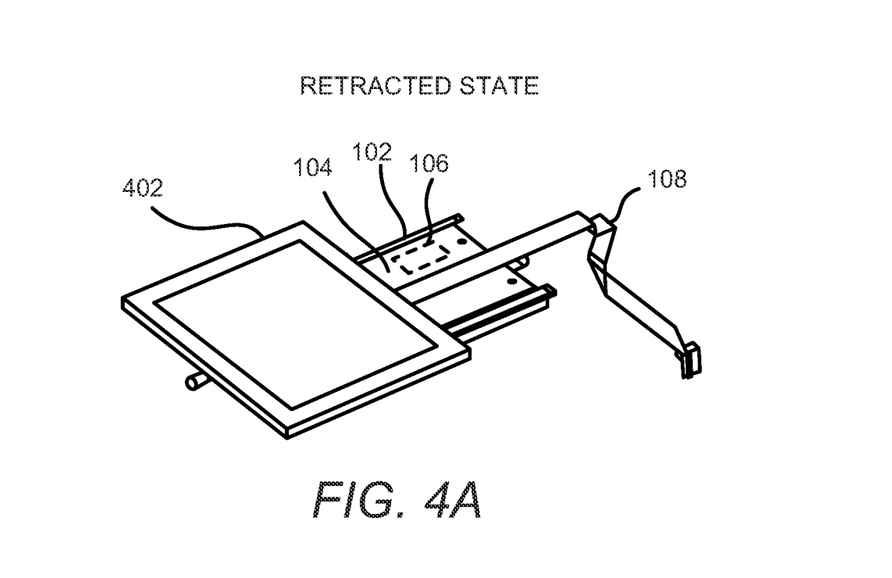
FIGS. 4A and 4B, respectively, show perspective views of an example retractable control panel assembly in a retracted state and an extended state, in which the example retractable control panel assembly may include a control panel mounted to the apparatus including the base, the sliding assembly, and the sensor assembly depicted in FIGS. 1A, 1B, and 2.
Figure 4B:
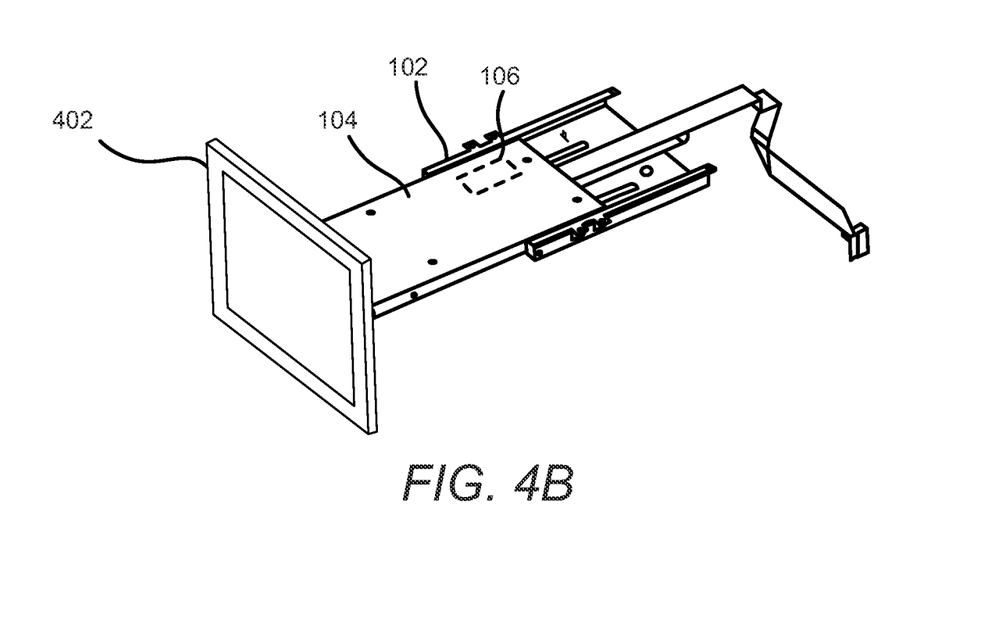

Reference is now made to FIGS. 4A and 4B. FIGS. 4A and 4B, respectively, show perspective views of an example retractable control panel assembly 400 in a retracted state and an extended state, in which the example retractable control panel assembly 400 may include a CP 402 mounted to the apparatus 100 including the base 102, the sliding assembly 104, and the sensor assembly 106 depicted in FIGS. 1A, 1B, and 2. The description of the example retractable control panel assembly 400 is made with reference to the features depicted in FIGS. 1A, 1B, 2, 3A, and 3B for purposes of illustration. It should be understood that the retractable control panel assembly 400 may include additional features and that some of the features described herein may be removed and/or modified without departing from the scope of the retractable control panel assembly 400.

The retractable control panel assembly 400 may include a CP 402, a base to support the CP 402, such as the base 102 depicted in FIGS. 1A and 1B, a sliding assembly disposed between the CP 402 and the base, such as the sliding assembly 104 depicted in FIGS. 1A and 1B, and a sensor assembly, such as the sensor assembly 106 depicted in FIGS. 1A and 1B, coupled to the sliding assembly 104. As discussed herein, the sensor assembly 106 may determine positions of the sliding assembly 104 relative to the base 102.

In some examples, the sensor assembly 106 may include a first sensor 202 disposed on the sliding assembly 104, a first tab 206 disposed on the sliding assembly 104, a second sensor 204 disposed on the sliding assembly 104, and a second tab 208 disposed on the base 102.

The first tab 206 may be positioned to trigger the first sensor 202 when the sliding assembly 104 is positioned in a transition state between an extended state, depicted in FIG. 4B, and a retracted state, depicted in FIG. 4A. The second tab 208 may be positioned to trigger the second sensor 204 when the sliding assembly 104 is positioned in the retracted state.

In some examples, the sliding assembly 104 may cause the first tab 206 to move in response to a movement of the sliding assembly 104 using a flexible arm 212. The flexible arm 212 may include including a sliding tab 214. The flexible arm 212 may be fixed to the sliding assembly 104, and may be positioned to correlate to a positon of a sliding track 216 disposed on the base 102. A shape of the sliding track 216, which may be in contact with the sliding tab 214, may cause the first tab 206 to move. For instance, the first tab 206 may be disposed to extend from a first side of the flexible arm 212, and the sliding tab 214 may be disposed on a second side of the flexible arm 212, opposite the first side. The first tab 206 may extend toward the first sensor 202, and a movement of the sliding tab 214 may cause correlating movement in the first tab 206.

The sliding track 216 may be disposed on the base 102 and may be positioned relative to the sliding tab 214 to be in contact with the sliding tab 214 throughout a range of motion of the sliding assembly 104, for instance from a fully retracted state to a fully extended state. The sliding track 216 may have a raised section 220 that, when in contact with the sliding tab 214, may cause the first tab 206 to be positioned toward the first sensor 202 to block a light 210 emitted from the first sensor 202. The raised section 220 may be positioned to correlate to the transition state of the sliding assembly 104 between the retracted state and the extended state.

In some examples, the second tab 208 may be positioned at a predetermined location on the base 102 to cause the second tab 208 to block a light 210 emitted from the second sensor 204 when the sliding assembly 104 is positioned in the retracted state.

In some examples, when the sliding assembly 104 is in the retracted state, the first sensor 202 may not be triggered and the second sensor 204 may be triggered by the second tab 208. Based on a determination that the sliding assembly 104 is in the retracted state, the CP 402 may display a first UI on the CP 402. In this instance, the CP 402 may be partially inserted into a body of an imaging device, and as such, a portion of a display area of the CP 402 may be visible. The first UI may have a first size that is smaller than a size of the display area of the CP 402.

In a case in which the sliding assembly 104 is in the transition state, the first sensor 202 may be triggered and the second sensor 204 may not be triggered. Based on a determination that the sliding assembly 104 is in the transition state, the CP 402 may display a second UI. In this instance, the CP 402 may be fully visible, but it may not be seated in a fully extended position. In this example, the second UI may include a message regarding a position of the sliding assembly 104, for instance, to instruct the user to properly seat the sliding assembly 104 in the extended position.

In a case in which the sliding assembly 104 is in the extended state, the first sensor 202 not be triggered and the second sensor 204 may not be triggered. Based on a determination that the sliding assembly 104 is in the extended state, the CP 402 may display a third UI. The third UI may have a second size that is larger than the first size. For instance, the third UI may be a full size UI.

Figure 5A:
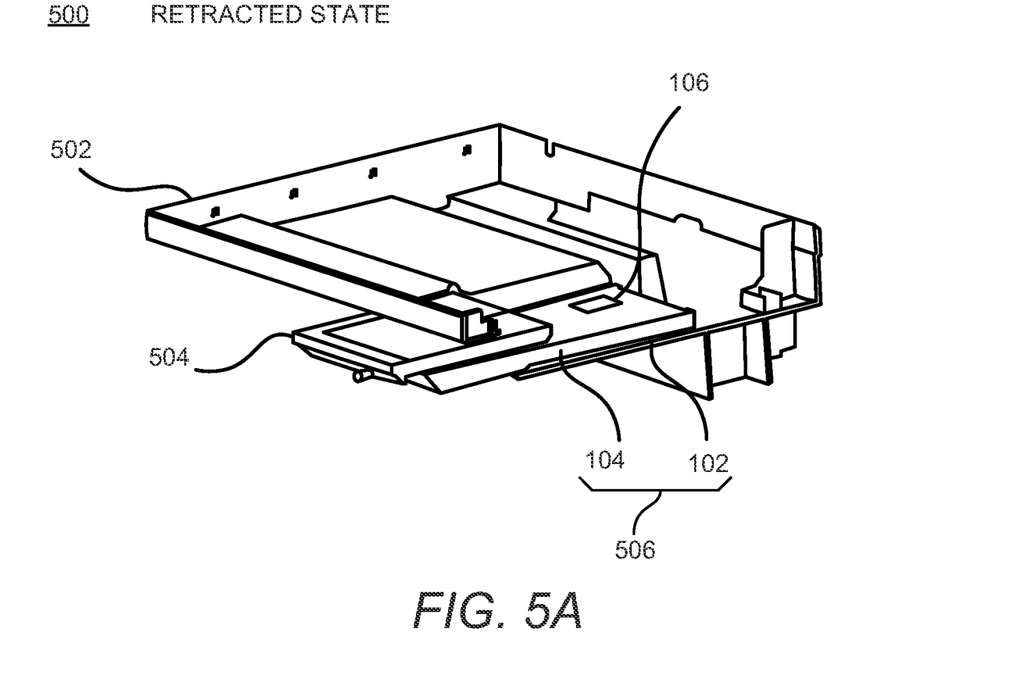
FIGS. 5A and 5B, respectively, show perspective views of an example imaging device including an example control panel assembly in a retracted state and an extended state, in which the example control panel assembly the base, the sliding assembly, and the sensor assembly depicted in FIGS. 1A, 1B, and 2.
Figure 5B:
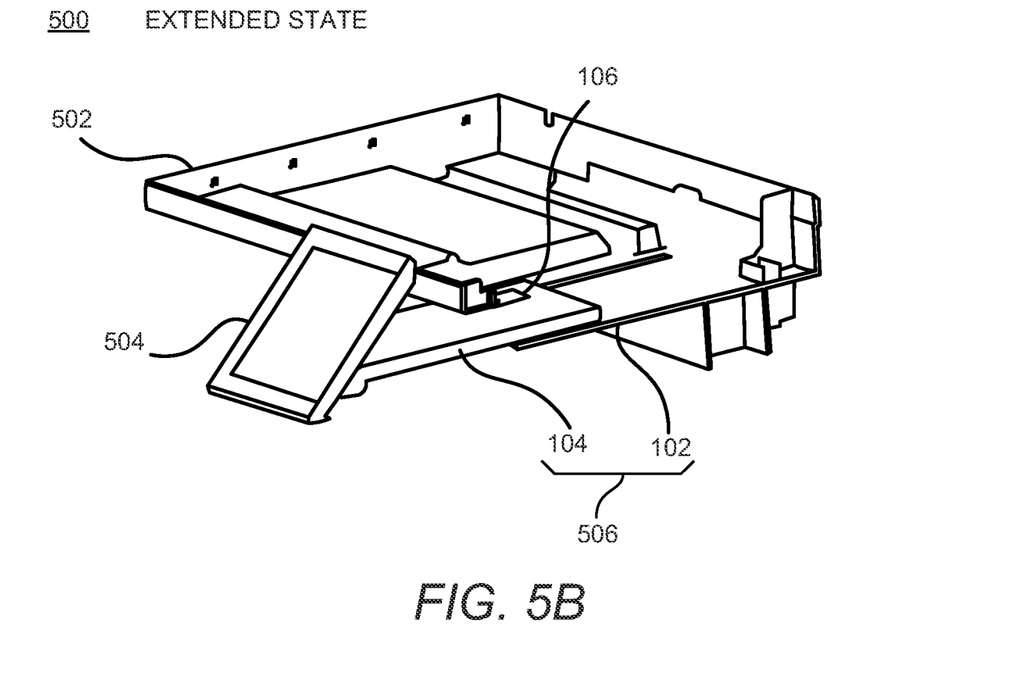

Reference is now made to FIGS. 5A and 5B. FIGS. 5A and 5B, respectively, show perspective views of an example imaging device 500 in a retracted state and an extended state, in which the example imaging device 500 may include the apparatus 100 including the base 102, the sliding assembly 104, and the sensor assembly 106 depicted in FIGS. 1A, 1B, and 2. The description of the example imaging device is made with reference to the features depicted in FIGS. 1A, 1B, 2, 3A, and 3B for purposes of illustration. It should be understood that the imaging device 500 may include additional features and that some of the features described herein may be removed and/or modified without departing from the scope of the imaging device 500.

The imaging device 500 may include a body 502, for instance an outer cover. The imaging device 500 may also include a CP 504 and a retractable mounting assembly 506 connected to the CP 504.

The retractable mounting assembly 506 may include a base 102, a sliding assembly 104 slideably coupled to the base 102, and a sensor assembly 106 coupled to the sliding assembly 104 to sense positions of the sliding assembly 104 relative to the base 102. The sensor assembly 106 may determine positional states of the sliding assembly 104 based on the sensed positions of the sliding assembly 104. In some examples, the positional states of the sliding assembly 104 may include a retracted state, an extended state, and a transition state.

The retracted state may be a state in which the sliding assembly 104 is retracted in the base 102. The extended state may be a state in which the sliding assembly 104 is extended from the base 102. The transition state may be a state in which the sliding assembly 104 is positioned between the retracted state and the extended state.

In some examples, the sensor assembly 106 may include a first sensor 202 disposed on the sliding assembly 104 and a first tab 206 disposed on the sliding assembly 104 and positioned to block the light 210 emitted from the first sensor 202 when the sliding assembly 104 is positioned in a first position.

The sensor assembly 106 may include a second sensor 204 disposed on the sliding assembly 104 and a second tab 208 disposed on the base 102 and positioned to block the light 210 emitted from the second sensor 204 when the sliding assembly 104 is positioned in a second position that is different than the first position.

In a case in which the sliding assembly 104 is positioned in the retracted state, the first sensor 202 may not be blocked by the first tab 206 and the second sensor 204 may be blocked by the second tab 208.

In a case in which the sliding assembly 104 is positioned in the transition state, the first sensor 202 may be blocked by the first tab 206 and the second sensor 204 may not be blocked by the second tab 208.

In a case in which the sliding assembly 104 is positioned in the extended state, the first sensor 202 may not be blocked by the first tab 206 and the second sensor 204 may not be blocked by the second tab 208.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example of the disclosure along with some of its variations. The terms, descriptions and figures used herein are set forth by way of illustration and are not meant as limitations. Many variations are possible within the scope of the disclosure, which is intended to be defined by the following claims—and their equivalents—in which all terms are meant in their broadest reasonable sense unless otherwise indicated.

What is claimed is:

1. An apparatus comprising:
   a base;
   a sliding assembly slideably coupled to the base, the sliding assembly to movably support a control panel; and
   a sensor assembly coupled to the sliding assembly to sense positions of the sliding assembly relative to the base, the sensor assembly comprising:
   a first sensor to sense that the sliding assembly is in a first position relative to the base; and
   a second sensor to sense that the sliding assembly is in a second position relative to the base, wherein a sensed state of the first sensor and a sensed state of the second sensor are to be used to determine that the sliding assembly is in a third position relative to the base.

2. The apparatus of claim 1, further comprising:
   a first tab disposed on the sliding assembly to trigger the first sensor, the first tab to move relative to the first sensor to trigger the first sensor when the sliding assembly is moved to the first position; and
   a second tab disposed on the base to trigger the second sensor, the second tab to move relative to the second sensor to trigger the second sensor when the sliding assembly is moved to the second position.

3. The apparatus of claim 2, wherein the first sensor and the second sensor are optoelectric sensors, and wherein:
   when the sliding assembly is in the first position, the first tab is positioned to block light emitted from the first sensor;
   when the sliding assembly is in the second position, the second tab is positioned to block light emitted from the second sensor; and
   when the sliding assembly is in the third position, the first tab and the second tab are positioned such that the light emitted from the first sensor is not blocked by the first tab and the light emitted from the second sensor is not blocked by the second tab.

4. The apparatus of claim 2, wherein the sliding assembly further comprises:
   a flexible arm disposed on the sliding assembly, a first end of the flexible arm being connected to the sliding assembly and a second end of the flexible arm being connected to the first tab, wherein the first tab is movable relative to the sliding assembly; and
   a sliding tab disposed on a surface of the flexible arm, the sliding tab to contact a surface of the base during movement of the sliding assembly relative to the base.

5. The apparatus of claim 4, wherein the base comprises:
   a sliding track that is in contact with the sliding tab throughout a range of motion of the sliding assembly, a position of the first tab relative to the first sensor being based on a height of the sliding track relative to the base.

6. The apparatus of claim 5, wherein the sliding track comprises:
   a first lower section having a first height relative to the base, the first height to position the first tab in a lowered position in which the first tab is not positioned adjacent to the first sensor, the first lower section being correlated with a retracted state of the sliding assembly;

a raised section having a second height from the base that is greater than the first height, the second height to position the first tab in a raised position in which the first tab is positioned adjacent to the first sensor to trigger the first sensor, the raised section being correlated with a transition state of the sliding assembly; and a second lower section having the first height to position the first tab in the lowered position, the second lower section being correlated with an extended state of the sliding assembly.

7. The apparatus of claim 6, wherein the sliding track comprises:

a step disposed between the raised section and the first lower section and/or the second lower section, the step to cause a haptic feedback as the sliding tab moves across the step to transition between the raised section and the first lower section and/or the second lower section.

8. The apparatus of claim 1, wherein the sensor assembly is to determine positional states of the sliding assembly including:

a retracted state in which the sliding assembly is retracted in the base;

an extended state in which the sliding assembly is extended from the base; and a transition state in which the sliding assembly is positioned between the retracted state and the extended state.

9. The apparatus of claim 8, wherein:

when the sliding assembly is in the retracted state, the first sensor is in an inactive state, in which the sliding assembly is not sensed by the first sensor, and the second sensor is in an active state, in which the sliding assembly is sensed by the second sensor;

when the sliding assembly is in the transition state, the first sensor is in the active state and the second sensor is in the inactive state; and when the sliding assembly is in the extended state, the first sensor is in the inactive state and the second sensor is in the inactive state.

10. A retractable control panel assembly comprising:

a control panel;

a base to support the control panel;

a sliding assembly disposed between the control panel and the base, the sliding assembly being slideably coupled to the base; and a sensor assembly coupled to the sliding assembly to determine positions of the sliding assembly relative to the base, the sensor assembly comprising:

a first sensor disposed on the sliding assembly;

a first tab disposed on the sliding assembly, the first tab being positioned to trigger the first sensor when the sliding assembly is positioned in a transition state between an extended state and a retracted state;

a second sensor disposed on the sliding assembly; and a second tab disposed on the base, the second tab being positioned to trigger the second sensor when the sliding assembly is positioned in the retracted state.

11. The retractable control panel assembly of claim 10, wherein the sliding assembly further comprises:

a flexible arm disposed on the sliding assembly, the first tab being disposed to extend from a first side of the flexible arm;

a sliding tab disposed on a second side of the flexible arm opposite the first side; and a sliding track disposed on the base and positioned relative to the sliding tab to be in contact with the sliding tab throughout a range of motion of the sliding assembly, the sliding track having a raised section that, when in contact with the sliding tab, causes the first tab to be positioned toward the first sensor to block a light emitted from the first sensor, the raised section being positioned to correlate to the transition state of the sliding assembly between the retracted state and the extended state.

12. The retractable control panel assembly of claim 10, wherein the second tab is positioned on the base to block a light emitted from the second sensor when the sliding assembly is positioned in the retracted state.

13. The retractable control panel assembly of claim 10, wherein:

when the sliding assembly is in the retracted state, the first sensor is not triggered and the second sensor is triggered by the second tab, and based on a determination that the sliding assembly is in the retracted state, the control panel displays a first user interface (UI) on the control panel, the first UI having a first size that is smaller than a size of a display area of the control panel;

when the sliding assembly is in the transition state, the first sensor is triggered and the second sensor is not triggered, and based on a determination that the sliding assembly is in the transition state, the control panel displays a second UI, the second UI to include a message regarding a position of the sliding assembly; and when the sliding assembly is in the extended state, the first sensor is not triggered and the second sensor is not triggered, and based on a determination that the sliding assembly is in the extended state, the control panel displays a third UI, the third UI having a second size that is larger than the first size.

14. An imaging device comprising:

a control panel; and a retractable mounting assembly connected to the control panel, the retractable mounting assembly comprising:

a base;

a sliding assembly slideably coupled to the base; and a sensor assembly coupled to the sliding assembly to sense positions of the sliding assembly relative to the base, the sensor assembly to determine positional states of the sliding assembly based on the sensed positions of the sliding assembly, the positional states including:

a retracted state in which the sliding assembly is retracted in the base;

an extended state in which the sliding assembly is extended from the base; and a transition state in which the sliding assembly is positioned between the retracted state and the extended state.

15. The imaging device of claim 14, wherein the sensor assembly further comprises:

a first sensor disposed on the sliding assembly;

a first tab disposed on the sliding assembly and positioned to block light emitted from the first sensor when the sliding assembly is positioned in a first position;

a second sensor disposed on the sliding assembly; and a second tab disposed on the base and positioned to block light emitted from the second sensor when the sliding assembly is positioned in a second position that is different than the first position, wherein:

when the sliding assembly is positioned in the retracted state, the first sensor is not blocked by the first tab and the second sensor is blocked by the second tab;

when the sliding assembly is positioned in the transition state, the first sensor is blocked by the first tab and the second sensor is not blocked by the second tab; and when the sliding assembly is positioned in the extended state, the first sensor is not blocked by the first tab and the second sensor is not blocked by the second tab.

\* \* \* \* \*